US012408328B2

(12) United States Patent
Ye et al.

(10) Patent No.: US 12,408,328 B2
(45) Date of Patent: Sep. 2, 2025

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Changfu Ye, Quanzhou (CN); Tsuo-Wen Lu, Quanzhou (CN); Mingqin Shangguan, Quanzhou (CN); Xiqin Wang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 439 days.

(21) Appl. No.: 17/888,525

(22) Filed: Aug. 16, 2022

(65) Prior Publication Data

US 2024/0040773 A1   Feb. 1, 2024

(30) Foreign Application Priority Data

Jul. 27, 2022  (CN) .......................... 202210893653.1
Jul. 27, 2022  (CN) .......................... 202221958948.4

(51) Int. Cl.
*H10B 12/00* (2023.01)

(52) U.S. Cl.
CPC ......... *H10B 12/485* (2023.02); *H10B 12/315* (2023.02); *H10B 12/482* (2023.02)

(58) Field of Classification Search
CPC ... H10B 12/485; H10B 12/315; H10B 12/482
See application file for complete search history.

(56) References Cited

U.S. PATENT DOCUMENTS

| 6,531,395 B1 * | 3/2003 | Hou ..................... H10B 12/482 |
| | | 438/629 |
| 6,552,401 B1 | 4/2003 | Dennison |
| 2023/0284436 A1 * | 9/2023 | Nagai ..................... H10B 12/34 |
| | | 257/296 |

* cited by examiner

*Primary Examiner* — Meiya Li
(74) *Attorney, Agent, or Firm* — Winston Hsu (57) ABSTRACT

The present disclosure provides a semiconductor device and a method of fabricating the same, the semiconductor device includes a substrate, an insulating layer, a plurality of bit lines, and a bit line contact. The insulating layer is disposed on the substrate, the bit lines are disposed on the insulating layer, and the bit line contact is disposed between the bit lines and the substrate, to electrically connect the bit lines, wherein the bit line contact comprises a first conductive layer and a first oxidized interface layer, and a bottommost surface of the first oxidized interface layer is lower than a top surface of the insulating layer. Through these arrangements, the semiconductor device includes the bit line contact having a composite semiconductor layer, which is allowable to improve the structural reliability of the bit lines and the bit line contacts, thereby achieve better performance.

11 Claims, 6 Drawing Sheets

SEMICONDUCTOR DEVICE AND METHOD OF FABRICATING THE SAME

BACKGROUND OF THE INVENTION

1. Field of the Invention

The present disclosure relates generally to a semiconductor device and a method of fabricating the same, and more particularly to a semiconductor memory device and a method of fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

An object of the present disclosure is to provide a semiconductor device and a fabricating method thereof, where a bit line contact having a composite conductive layer is formed to improve the structural reliability of the bit lines and the bit line contact. Then, the semiconductor device may therefore achieve better functions and performance.

To achieve the aforementioned objects, the present disclosure provides a semiconductor device including a substrate, an insulating layer, a plurality of bit lines, and a bit line contact. The insulating layer is disposed on the substrate, and the bit lines are disposed on the substrate. The bit line contact is disposed between the bit lines and the substrate, to electrically connect the bit lines, wherein the bit line contact includes a first conductive layer and a first oxidized interface layer, and a bottommost surface of the first oxidized interface layer is lower than a top surface of the insulating layer.

To achieve the aforementioned objects, the present disclosure provides a method of fabricating a semiconductor device including the following steps. Firstly, a substrate is provided, and an insulating layer is formed on the substrate. Next, a plurality of bit lines is formed on the substrate, and a bit line contact is formed between the bit lines and the substrate, to electrically connect the bit lines, wherein the bit line contact includes a first conductive layer and a first oxidized interface layer, and a bottommost surface of the first oxidized interface layer is lower than a top surface of the insulating layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 9 illustrate schematic diagrams of a fabricating method of a semiconductor device according to first embodiment of the present disclosure, wherein:

FIG. 10 to FIG. 11 illustrate schematic diagrams of a fabricating method of a semiconductor device according to second embodiment of the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
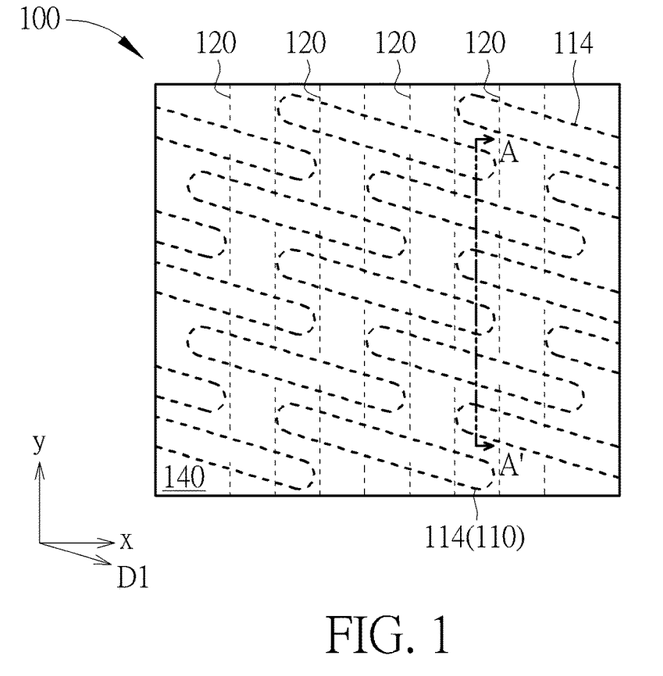
FIG. 1 is a schematic top view of a semiconductor device after forming a mask layer.
Figure 2:
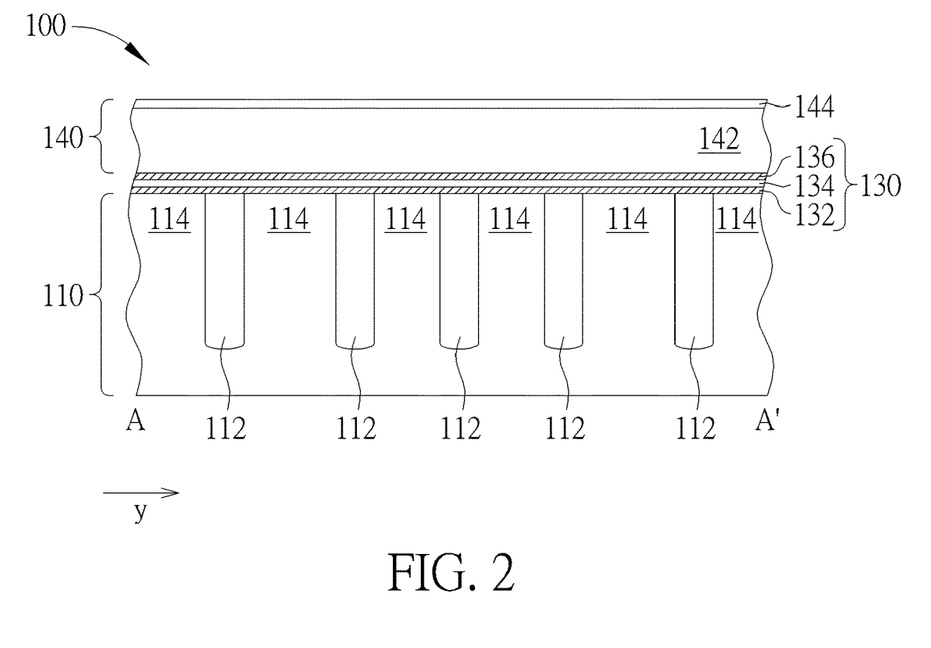
FIG. 2 is a schematic cross-sectional view taken along a cross line A-A' in FIG. 1.
Figure 3:
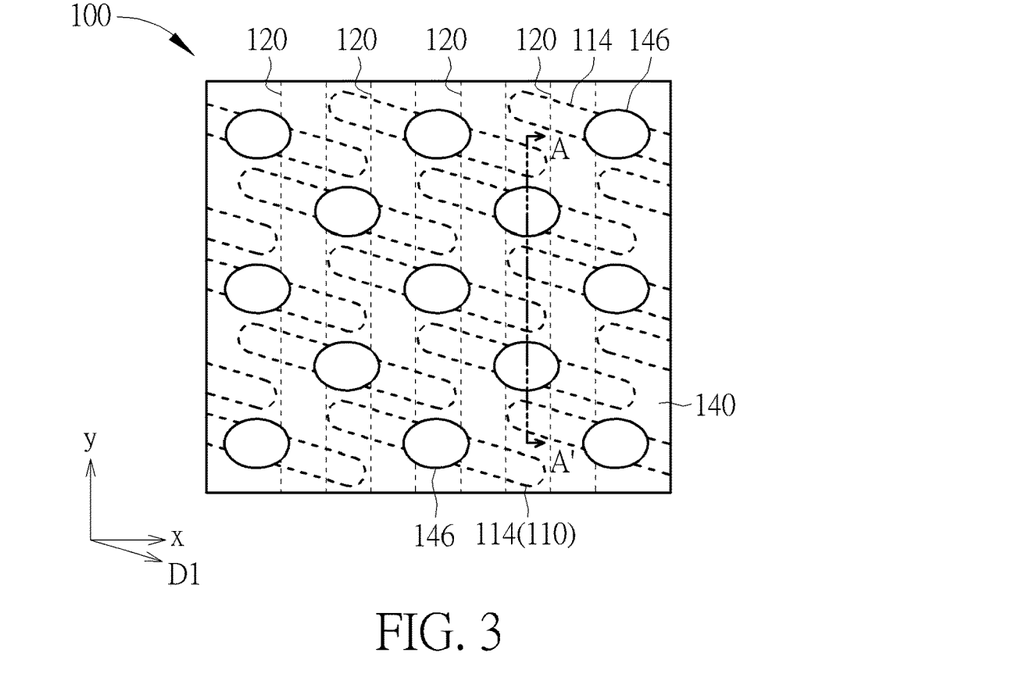
FIG. 3 is a schematic top view of a semiconductor device after forming a bit line contact opening.
Figure 6:
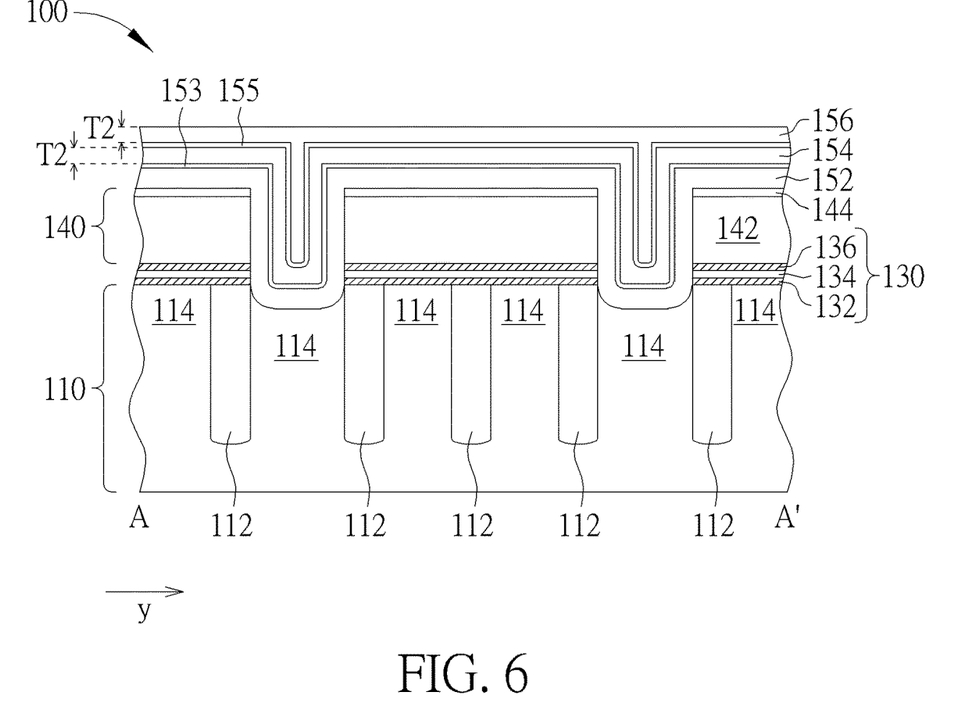
FIG. 6 is a schematic cross-sectional view of a semiconductor device after forming another oxidized interface layer.
Figure 7:
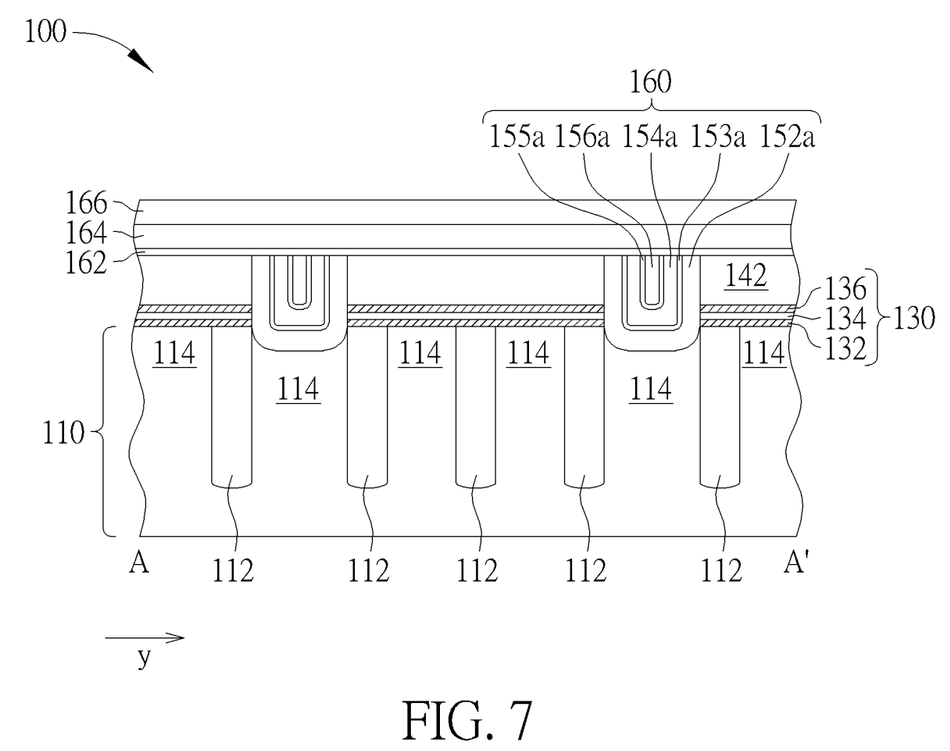
FIG. 7 is a schematic cross-sectional view of a semiconductor device after forming bit line stacked layers.
Figure 8:
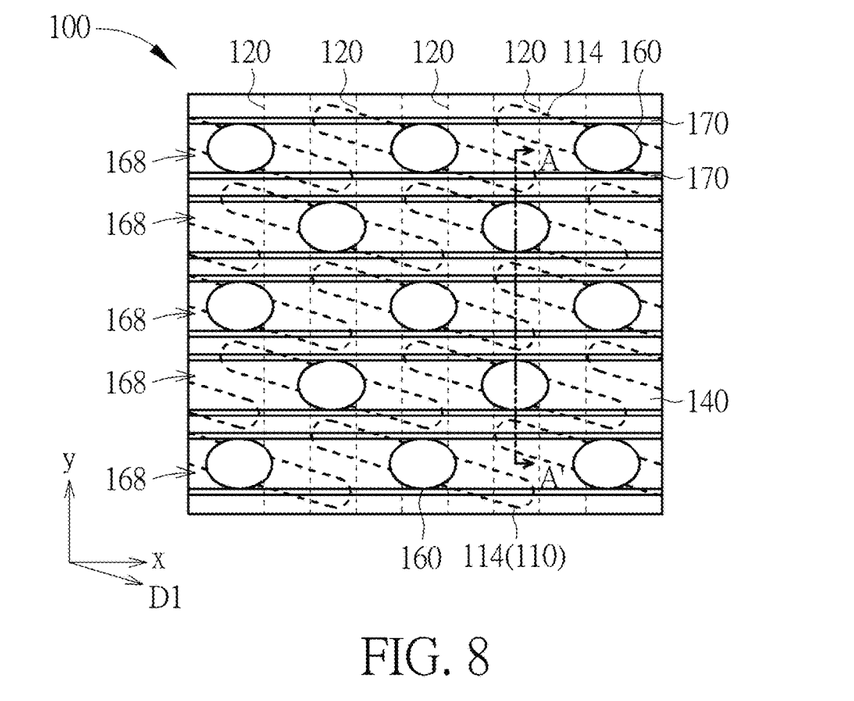
FIG. 8 is a schematic top view of a semiconductor device after forming a bit line.

Please refer to FIG. 1 to FIG. 9, which illustrate schematic diagrams of a semiconductor device 100 according to the first embodiment of the present disclosure, with FIG. 1, FIG. 3, and FIG. 8 respectively illustrating a top view of the semiconductor device 100 during various fabricating processes, and with FIG. 2, FIG. 4 to FIG. 7, and FIG. 9 respectively illustrating a cross-sectional view of the semiconductor device 100 during various fabricating processes. Firstly, as shown in FIG. 1 and FIG. 2, a substrate 110, for example a silicon substrate, a silicon containing substrate (such as SiC or SiGe), or a silicon-on-insulator (SOI) substrate, is provided, and at least one shallow trench isolation (STI) 112 is formed in the substrate 110, to define a plurality of active areas (AAs) 114, with all of the active areas 114 being surrounded by the shallow trench isolation 112, as shown in FIG. 1.

Precisely speaking, the active areas 114 is parallel extended with each other along a same direction D1, with each of the active areas 114 having the same length and the same pitch, wherein the direction D1 for example intersects and is not perpendicular to the y direction or the x direction, as shown in FIG. 1, but not limited thereto. In one embodiment, the formation of the shallow trench isolation 112 is accomplished by firstly performing an etching process to form a plurality of trenches (not shown in the drawings), followed by filling in an insulating material (such as silicon oxide or silicon oxynitride) in the trenches, but is not limited thereto.

Also, at least two regions are defined on the substrate 110, for example including a memory cell region (not shown in the drawings) being relative higher integrity and a periphery region (not shown in the drawings) being relative lower integrity, and a plurality of buried word lines 120 is formed in the substrate 110, within the memory cell region, wherein the buried word lines 120 are parallelly extended with each other in the y-direction, to intersect with each of the active areas 114. In one embodiment, the formation of the buried word lines 120 includes but not limited to the following steps. Firstly, a plurality of trenches (not shown in the drawings) parallelly and separately extended along the y-direction is formed in the substrate 110. Next, a dielectric layer (not shown in the drawings) covering entire surfaces of each of the trenches, a gate dielectric layer (not shown in the drawings) covering surfaces of a bottom portion of each of the trenches, and a gate electrode (not shown in the drawings) filled in the bottom portion of each of the trenches, are sequentially formed in each of the trenches. Then, after removing the gate electrode and the gate dielectric layer formed in a top portion of each of the trenches through an etching process, a covering layer (not shown in the drawings) filled in the top portion of each of the trenches is formed. Accordingly, the covering layer may therefore have a top surface leveled with a top surface of the substrate 110, so that, the gate electrode, the gate dielectric layer and the dielectric layer formed in the substrate 110 may together form the buried word lines 120 of the semiconductor device 100 for accepting or transmitting the voltage signals from memory cells (not shown in the drawings).

As shown in FIG. 1 and FIG. 2, an insulating layer 130, and a mask layer 140 are sequentially formed on the substrate 110, entirely covering the top surface of the substrate 110, wherein the insulating layer 130 preferably includes a composite structure for example including an oxide layer 132-a nitride layer 134-an oxide layer 136 (ONO) structure, but is not limited thereto. The mask layer 140 for example includes a semiconductor layer 142 and a protection layer 144 formed sequentially on the insulating layer 130, wherein the semiconductor layer 142 for example includes a semiconductor material like doped silicon, doped phosphorus or silicon phosphide (SiP), and preferably includes doped silicon, but not limited thereto. The protection layer 144 for example includes a material like silicon oxide or silicon oxynitride (SiON), but not limited thereto.

Figure 4:
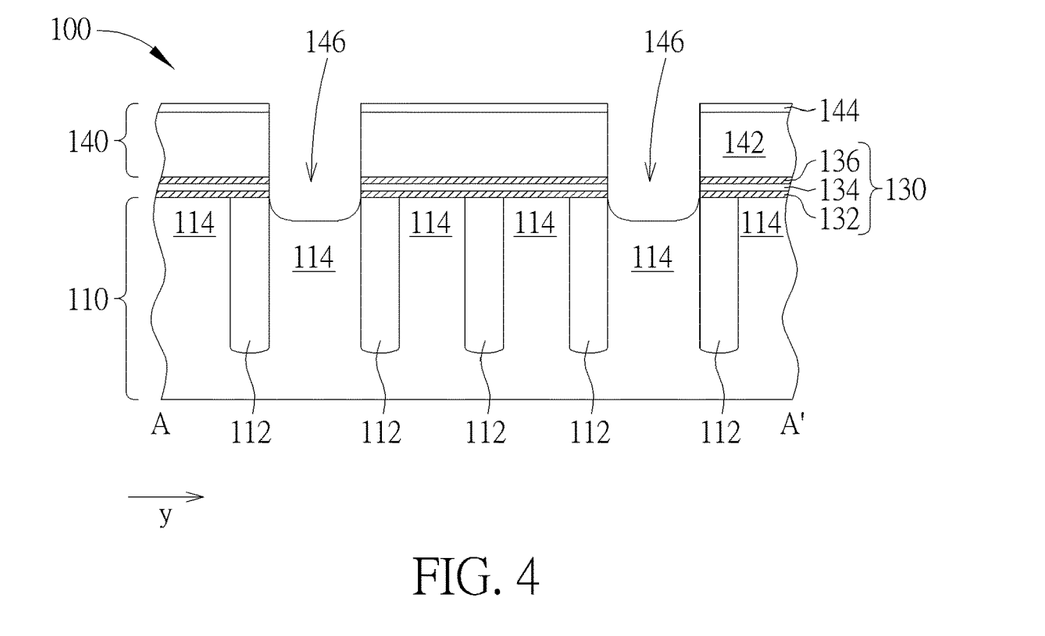
FIG. 4 is a schematic cross-sectional view taken along a cross line A-A' in FIG. 3.

Then, as shown in FIG. 3 and FIG. 4, a plurality of contact openings 146 is formed in the mask layer 140, with each of the contact openings 146 penetrating through the protection layer 144, the semiconductor layer 142, and the insulating layer 130 to extend into the substrate 110, and with a portion of the active areas 114 being exposed from the contact openings 146. The formation of the contact openings 146 includes but not limited to the following steps. Firstly, a mask structure (not shown in the drawings) is formed on the substrate 110, with the mask structure for example including a sacrificial layer (not shown in the drawings, for example including an organic dielectric layer), a silicon-containing hard mask (SHB, not shown in the drawings), and a patterned photoresist layer (not shown in the drawings) stacked one over another on the protection layer 144. The patterned photoresist layer includes at least one pattern for defining the contact openings 146, and an etching process such as a dry etching process is performed through the patterned photoresist layer, to form the contact openings 146 in the insulating layer 130, the semiconductor layer 142, and the protection layer 144, wherein each of the contact openings 146 is in alignment with each of the active areas 114. It is noted that, each of the contact openings 146 is formed between two adjacent ones of the buried word lines 120 as shown in FIG. 3, so that, a portion of the active areas 114 (namely, the substrate 110) may be exposed from the bottom of the contact openings 146, as shown in FIG. 4. After that, the mask structure is completely removed.

Figure 5:
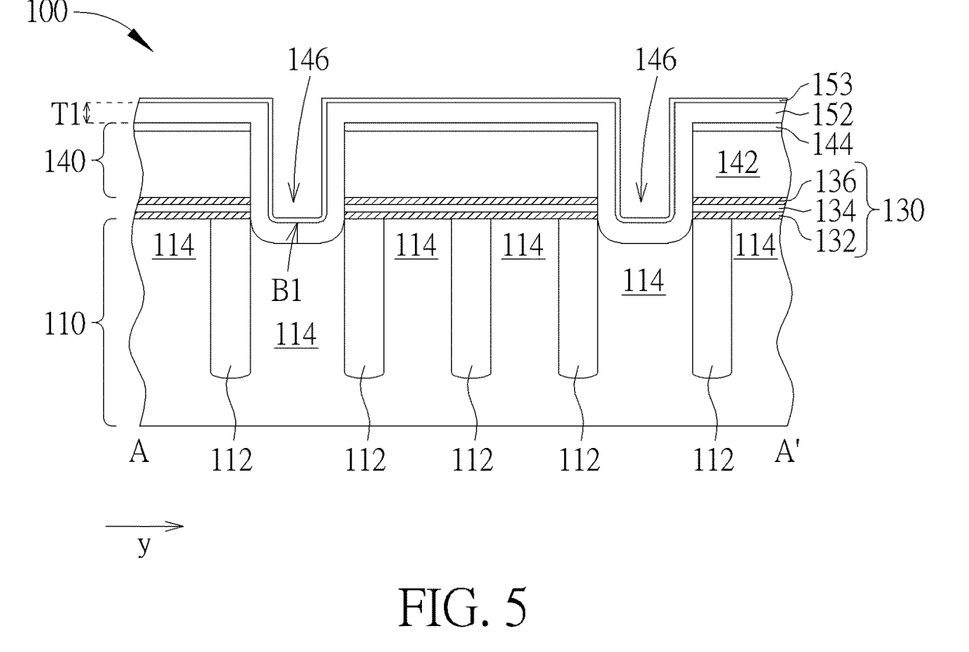
FIG. 5 is a schematic cross-sectional view of a semiconductor device after forming an oxidized interface layer.

As shown in FIG. 5, a first semiconductor material layer 152 is formed on the substrate 110, entirely covering the mask layer 140, and surfaces of each contact opening 146 without filling the contact openings 146, wherein the first semiconductor material layer 152 for example includes a semiconductor material like doped silicon, doped phosphorus, or silicon phosphide, but not limited thereto. It is noted that, in the present embodiment, after forming the first semiconductor material layer 152, the lattice structure of the surface of the first semiconductor material layer 152 is destroyed by breaking the vacuum or introducing oxygen, so that the lattice structure of a semiconductor material layer deposited on the top in the subsequent process will not continuously grow along the lattice structure of the first semiconductor material layer 152, so as to obtain a relatively smaller grain size. Accordingly, a first oxidized interface layer 153 is further formed on the surface of the first semiconductor material layer 152, and the first oxidized interface layer 153 for example includes silicon oxide, phosphorus oxide or silicon phosphorus oxide, and preferably includes silicon phosphorus oxide, but not limited thereto. In one embodiment, since the first oxidized interface layer 153 is conformally formed on the surface of the first semiconductor material layer 152, an U-shaped cross-section may be obtained thereby within each contact opening 146, as shown in FIG. 5.

Furthermore, it is also known that, a thickness of the first oxidized interface layer 153 is quite thin, for example being about angstroms to 1 angstroms, and which may not affect the electrical connection between the bit line contacts and other elements. In one embodiment, the formation of the first semiconductor material layer 152 is for example carried out through a deposition process such as a chemical vapor deposition (CVD) process, and preferably through a selective epitaxial growing (SEG) process, to precisely monitor a thickness T1 of the first semiconductor material layer 152, preferably being about 20-50 nanometers (nm), but not limited thereto. In this way, the first oxidize interface layer 153 formed over the first semiconductor material layer 152 may therefore obtain a relative lower forming position within each contact opening 146, for example being lower than the top surface of the insulating layer 130. In one embodiment, a bottommost surface B1 of the first oxidized interface layer 153 is for example lower than the top surface of the insulating layer (namely, the top surface of the oxide layer 136), even lower than the bottommost surface of the insulating layer 130 (namely, the bottom surface of the oxide layer 132), as shown in FIG. 5.

As shown in FIG. 6, a deposition process such as a chemical vapor deposition is performed, to sequentially form a second semiconductor material layer 154 and a third semiconductor material layer 156 on the substrate 110, wherein the second semiconductor material layer 154 entirely covers the first semiconductor material layer 152, to partially fill in each contact opening 146, and the third semiconductor material layer 156 further covers on the second semiconductor material layer 154, to fill up the rest space of each contact opening 146. The second semiconductor material layer 154 and the third semiconductor material layer 156 for example include a semiconductor material like doped silicon, doped phosphorus, or silicon phosphide, but not limited thereto. In one preferably embodiment, the forming process of the second semiconductor material layer 154 and the third semiconductor material layer 156 may be different from that of the first semiconductor material layer 152, for example, the second semiconductor material layer 154 and the third semiconductor material layer 156 may be formed through a CVD process, and the first semiconductor material layer 152 maybe formed through a SEG process, but not limited thereto. Also, the first semiconductor material layer 152, the second semiconductor material layer 154, and the third semiconductor material layer 156 include the same material like silicon phosphide, but not limited thereto.

As the semiconductor material of the second semiconductor material layer 154 may also generate a second oxidize interface layer 155 through breaking vacuum or introducing oxygen, the second oxidize interface layer 155 may be formed between the second semiconductor material layer 154 and the third semiconductor material layer 156, and also, to obtain an U-shaped cross-section within each contact opening 146, as shown in FIG. 6. The second oxidized interface layer 155 for example includes silicon oxide, silicon nitride, or silicon phosphorus oxide, and preferably includes silicon phosphorus oxide, but not limited thereto. It is noted that, a thickness of the second oxidized interface layer 155 is also quite thin, for example being about 0.01 angstroms to 1 angstroms, and which will not affect the electrical connection between the bit line contacts and other elements formed in the subsequent processes. Furthermore, it is also noted that, the second semiconductor material layer 154 and the third semiconductor material layer 156 stacked sequentially on the first semiconductor material layer 152 preferably include a relative smaller thickness T2, for example being about 10-20 nanometers, but not limited thereto. Accordingly, the second semiconductor material layer 154 and the third semiconductor material layer 156 stacked over the first semiconductor material layer 152 may therefore obtain a relative smaller grain size and a relative finer lattice structure, so as to present a further smooth surface.

As shown in FIG. 7, an etching process such as a dry etching process is performed, to completely remove the third semiconductor material layer 156, the second semiconductor material layer 154, and the first semiconductor material layer 152 covered on the top surface of the mask layer 140, and to further remove the mask layer 140 underneath, with the protection layer 144 being completely removed and with the semiconductor layer 142 being partially removed. Meanwhile, the third semiconductor material layer 156, the second semiconductor material layer 154, and the first semiconductor material layer 152 filled in each contact opening 146 are all partially removed, so that, a semiconductor layer 152a, a first oxidized interface layer 153a, a first conductive layer 154a, a second oxidized interface layer 155a, and a second conductive layer 156a are sequentially formed within each contact opening 146, thereby forming a plurality of bit line contacts (BLC) 160 filled in each contact opening 146 respectively, wherein the first oxidized interface layer 153a and the second oxidized interface layer 155a both include an U-shape cross-section as shown in FIG. 7. Then, the top surface of each of the bit line contacts 160 may be coplanar with the top surface of the etched semiconductor layer 142, as shown in FIG. 7.

Following these, a deposition process is then performed to form a barrier material layer 162, a metal material layer 164, and a covering material layer 166 stacked sequentially on the semiconductor layer 142. Precisely speaking, the barrier material layer 162 entirely covers the semiconductor layer 142 and the bit line contacts 160, to directly in contact with the semiconductor layer 142 and the bit line contacts 160 disposed underneath, and the metal material layer 164 and the covering material layer 166 are sequentially covering on the barrier material layer 162. In one embodiment, the barrier material layer 162 for example includes tantalum (Ta) and/or tantalum nitride (TaN), or titanium (Ti) and/or titanium. nitride (TiN), and the metal material layer 164 for example includes a low-resistant metal like aluminum (Al), titanium, copper (Cu), or tungsten (W), and the covering material layer 166 for example includes a dielectric material like silicon oxide, silicon nitride, or silicon oxynitride, but is not limited thereto.

Figure 9:
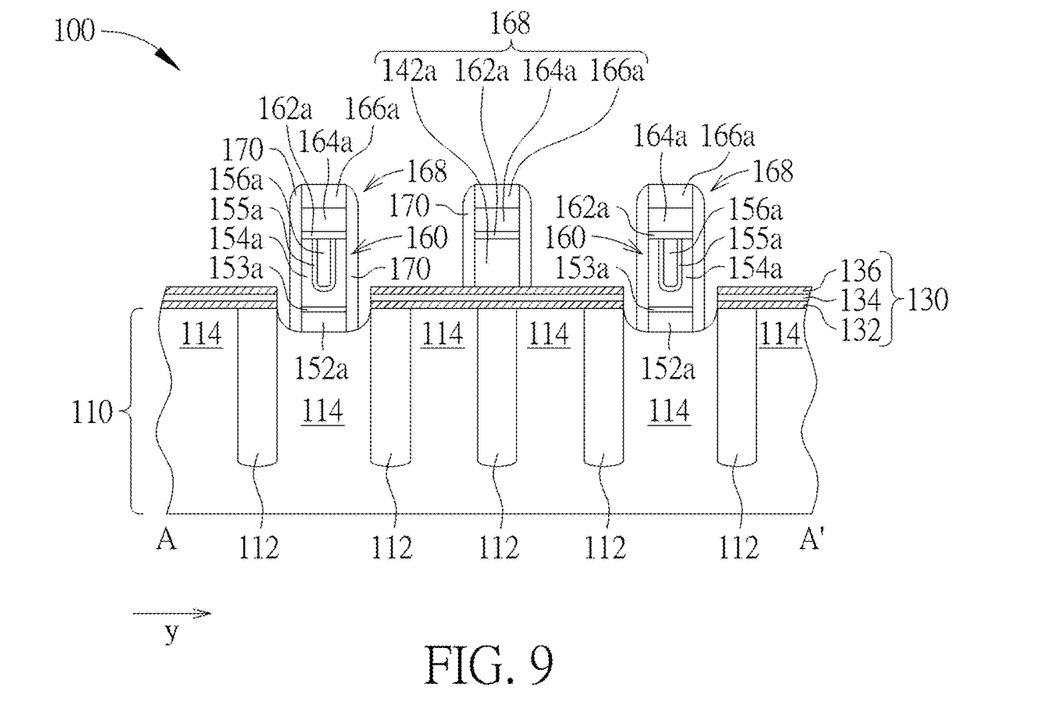
FIG. 9 is a schematic cross-sectional view taken along a cross line A-A' in FIG. 8.

Then, as shown in FIG. 8 and FIG. 9, a photolithography process is performed, and the semiconductor layer 142, the barrier material layer 162, the conductive material layer 164, and the capping material layer 166 stacked sequentially are patterned through a mask layer (not shown in the drawings), to form a plurality of bit lines 168 extended along the x-direction in the memory cell region of the substrate 110, across the active areas 114 and the buried word lines 120. Precisely speaking, each of the bit lines 168 includes a semiconductor layer 142a, a barrier layer 162a, a metal layer 164a, and a capping layer 166a stacked sequentially from bottom to top. It is noted that, since the bit line contacts 160 each is formed under the barrier layer 162a of a corresponding bit line 168, the semiconductor layer 142a of the corresponding bit line 168 is not illustrated in the cross-sectional view as shown in FIG. 9, and the semiconductor layer 142a of the corresponding bit line 168 is formed at two sides to each bit line contact 160 in the x-direction as being viewed from a top view as shown in FIG. 8. It is noted that the bit line contacts 160 are further disposed below a portion of the bit lines 168, so that, the portion of the bit lines 168 may enable to extend into the active areas 114 of the substrate 110, to directly contact the active areas 114. The bit line contacts 160 are also patterned during performing the photolithography process, with the semiconductor layer 152a and the first oxidized interface layer 153a disposed at two sides of each bit line contact 160 being partially removed. Then, each of the bit line contacts 160 may include a composite conductive layer, which includes the semiconductor layer 152a, the first oxidized interface layer 153a, the first conductive layer 154a, the second oxidized interface layer 155a, and the second conductive layer 156a stacked sequentially, with the first oxidized interface layer 153a having a linear cross-section, and with the second oxidized interface layer 155a having an U-shaped cross-section, as shown in FIG. 9.

Furthermore, as shown in FIG. 8 and FIG. 9, a deposition process and an etching back process are sequentially performed, to form a plurality of bit line spacers 170 on two opposite sidewalls of each of the bit lines 168, respectively. It is noted that, a portion of the bit line spacers 170 further extends into active areas 114 of the substrate 110 to cover on sidewalls of each of the bit line contacts 160, and the portion of the bit line spacers 170 may directly contact two opposite ends of the linear first oxidized interface layer 153a, as shown in FIG. 9.

Through the above-mentioned processes, the semiconductor device 100 according to the first embodiment of the present disclosure is formed. Accordingly to the fabricating method of the present embodiment, the semiconductor layer 142 entirely covering the substrate 110 is firstly formed, followed by defining the contact openings 146 through the semiconductor layer 142, and forming the bit line contacts 160 in the contact openings 146. The fabrication of the bit line contacts 160 is carried out by a multi-stepped deposition process, or by an epitaxial process combined with a deposition process, so that each of the bit line contacts 160 may therefor obtain a composite conductive layer, which includes the semiconductor layer 152a, the first conductive layer 154a, and the second conductive layer 156a stacked sequentially. It is noted that, the semiconductor layer 152a, the first conductive layer 154a, and the second conductive layer 156a may respectively include the same semiconductor material or different semiconductor materials, such as doped silicon, doped phosphorus, or silicon phosphide, and preferably all include silicon phosphide. Also, the first conductive layer 154a and the second conductive layer 156a disposed over the semiconductor layer 152a are preferably include a relative smaller thickness T2, for example being about 10-20 nanometers, so that, the top surface of each of the bit line contacts 160 may obtain a relative smaller grain size and a relative finer lattice structure, to present further smooth surface thereby.

Furthermore, while the composite conductive layer is formed after forming the semiconductor material, through breaking vacuum or introducing oxygen, the lattice structure at the top of the semiconductor material is broken, and the first oxidized interface layer 153a is additionally formed between the semiconductor layer 152a and the first conductive layer 154a, and the second oxidized interface layer 155a is additionally formed between the first conductive layer 154a and the second conductive layer 156a. The first oxidized interface layer 153a includes a linear cross-section, and the second oxidized interface layer 155a still includes an U-shaped cross-section, and the first oxidized interface layer 153a and the second oxidized interface layer 155a are respectively disposed at the bottom surface and the top surface of the first conductive layer 154a, but not limited thereto. The thickness of the first oxidized interface layer 153a and the second oxidized interface layer 155a is quite thin, for example being about 0.01-1 angstroms. In this way, the existing of first oxidized interface layer 153a and the second oxidized interface layer 155a will not affect the electrical connection between each bit line 168 and each bit line contact 160, and which may further improve the grain size and the lattice structure of the bit line contacts 160 (being more smooth), so as to improve the structural defects of the semiconductor material, such as excessive grain size and rough surface layer, caused by thicker stacked films. Then, the fabricating method of present disclosure is allowable to form the semiconductor device 100 with better performances under a simplified process flow.

People in the art shall easily realize that the semiconductor device and the method of fabricating the same in the present disclosure are not limited to the aforementioned embodiment, and may include other examples. The following description will detail the different embodiments of the semiconductor device and method of fabricating the same in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
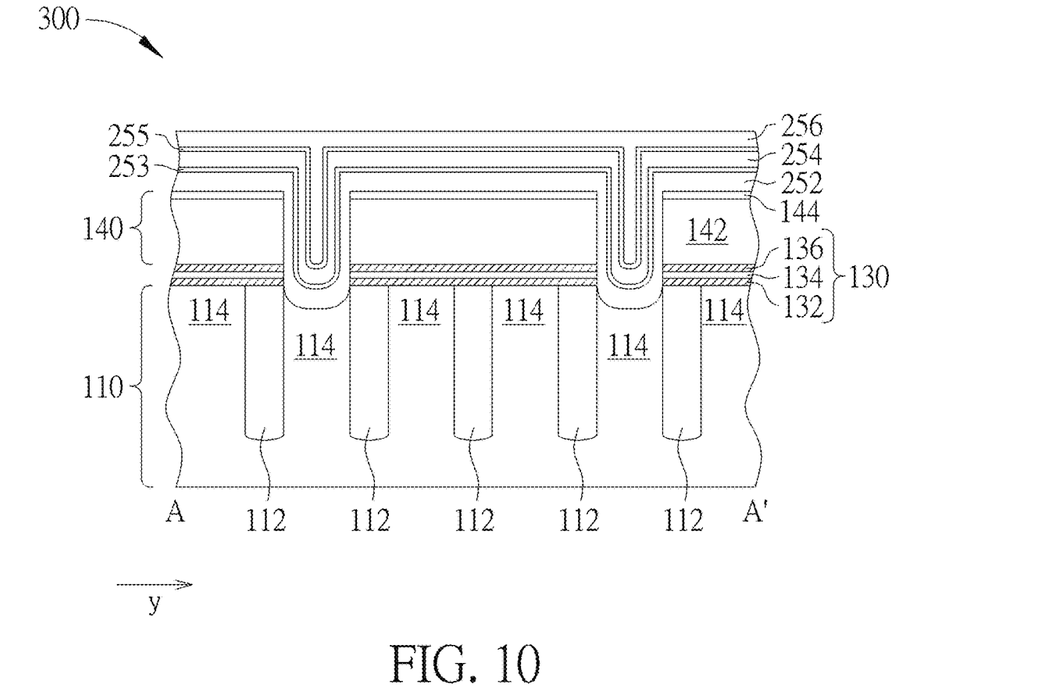
FIG. 10 is a schematic cross-sectional view of a semiconductor device after forming an oxidized interface layer.
Figure 11:
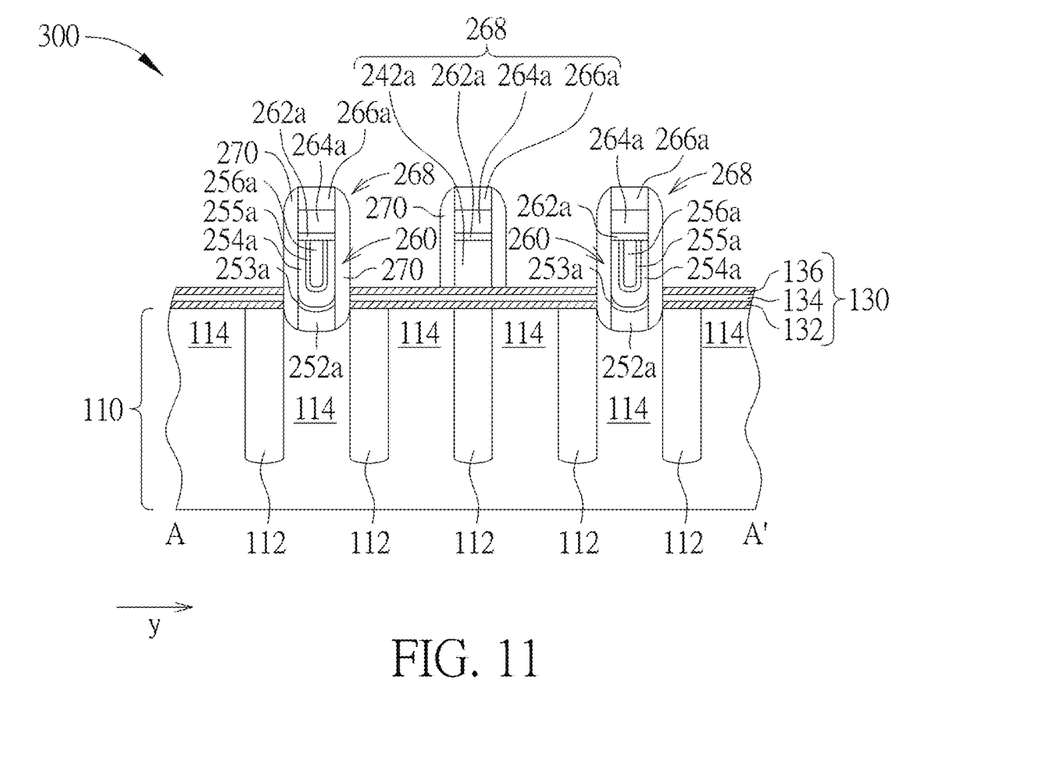
FIG. 11 is a schematic cross-sectional view of a semiconductor device after forming a bit line.

Please refer to FIG. 10 and FIG. 11, which illustrate schematic diagrams of a semiconductor device 300 according to the second embodiment in the present disclosure. The forming process at the front end of the present embodiment is substantially the same or similar to those in the first embodiment for example being illustrated in FIGS. 1-5, and those steps will not be redundantly described herein. The difference between the present embodiment and the aforementioned first embodiment is in that the contact openings of the present embodiment include a relative smaller diameter, and each of the bit line contacts 260 formed subsequently in the contact openings may therefore include the first oxidized interface layer 253a and the second oxidized interface layer 255a both in an U-shaped cross-section.

Precisely speaking, as shown in FIG. 10, a SEG process and a deposition process are sequentially performed on the substrate 110, to form a first semiconductor material layer 252, a second semiconductor material layer 254, and a third semiconductor material layer 256 stacked from bottom to top, wherein the first semiconductor material layer 252, the second semiconductor material layer 254, and the third semiconductor material layer 256 for example include a semiconductor material like doped silicon, doped phosphorus or silicon phosphide, and preferably includes silicon phosphide, but not limited thereto. Also, as the semiconductor materials of the first semiconductor material layer 252, the second semiconductor material layer 254, and the third semiconductor material layer 256 are treated by breaking the vacuum or introducing oxygen, a first oxidized interface layer 253 is additionally formed between the first semiconductor material layer 252 and the second semiconductor material layer 254, and a second oxidized interface layer 255 is additionally formed between the second semiconductor material layer 254 and the third semiconductor material layer 256. The first oxidized interface layer 253 and the second oxidized interface layer 255 respectively include a quite thin thickness, for example being about 0.01-1 angstroms, and which will not affect the electrical connection between each bit line contact and other elements formed subsequently. In one embodiment, the first oxidized interface layer 253 and the second oxidized interface layer 255 for example include silicon oxide, phosphorus oxide, or silicon phosphorus oxide, and preferably both include silicon phosphorus oxide, but not limited thereto.

Then, an etching process and a deposition process are sequentially performed, to form a barrier material layer (not shown in the drawings), a metal material layer (not shown in the drawings), and a capping material layer (not shown in the drawings) stacked sequentially, after partially removing the third semiconductor material layer 256, the second semiconductor material layer 254, the first semiconductor material layer 252, and the mask layer 140. Following these, after performing the photolithography process, the semiconductor layer 142, the barrier material layer, the metal material layer, and the capping material layer stacked sequentially are patterned to form a plurality of bit lines 268. As shown in FIG. 11, each of the bit lines 268 includes a semiconductor layer 242a, a barrier layer 262a, a metal layer 264a, and a capping layer 266a stacked from bottom to top. It is noted that, since the bit line contacts 260 each is formed under the barrier layer 262a of a corresponding bit line 268, the semiconductor layer 242a of the corresponding bit line 268 is not illustrated in the cross-sectional view as shown in FIG. 11, and the semiconductor layer 242a of the corresponding bit line 268 is formed at two sides of the bit line contacts 260 in the x-direction as being viewed from a top view (not shown in the drawings). It is noted that, the bit line contacts 260 are disposed under a portion of the bit lines 268, to further extend into the active areas 114 of the substrate 110 to directly contact thereto. Furthermore, the bit line contacts 260 are also patterned through the photolithography process, to partially remove the first semiconductor material 252 disposed at two sides of each bit line contact 260. Accordingly, each of the bit line contacts 260 may include a composite conductive layer, which includes the semiconductor layer 252a, the first oxidized interface layer 253a, the first conductive layer 254a, the second oxidized interface layer 255a, and the second conductive layer 256a stacked sequentially, with the first oxidized interface layer 253a and the second oxidized interface layer 255a both having an U-shaped cross-section, as shown in FIG. 11.

After that, as shown in FIG. 11, a deposition process and an etching back process are sequentially performed, to form a plurality of bit line spacers 270 on two opposite sidewalls of each of the bit lines 268, respectively. It is noted that, a portion of the bit line spacers 270 further extends into active areas 114 of the substrate 110 to cover on sidewalls of each of the bit line contacts 260, and the portion of the bit line spacers 270 may directly contact two opposite ends of the U-shaped first oxidized interface layer 253a, as shown in FIG. 11.

Through the above-mentioned processes, the semiconductor device 300 according to the second embodiment of the present disclosure is formed. Accordingly to the fabricating method of the present embodiment, the formation of the bit line contacts 260 is also carried out by an epitaxial process combined with a deposition process, so that each of the bit line contacts 260 may therefor obtain a composite conductive layer, which includes the semiconductor layer 252a, the first conductive layer 254a, and the second conductive layer 256a stacked sequentially. It is noted that, the semiconductor layer 252a, the first conductive layer 254a, and the second conductive layer 256a may respectively include the same semiconductor material or different semiconductor materials, such as doped silicon, doped phosphorus, or silicon phosphide, and the first oxidized interface layer 253a is additionally formed between the semiconductor layer 252a and the first conductive layer 254a, and the second oxidized interface layer 255a is additionally formed between the first conductive layer 254a and the second conductive layer 256a, with the first oxidized interface layer 253a and the second oxidized interface layer 255a both including an U-shaped cross-section. In this way, the existing of first oxidized interface layer 253a and the second oxidized interface layer 255a will not affect the electrical connection between each bit line 268 and each bit line contact 260, and which may further improve the grain size and the lattice structure of the bit line contacts 260 (being more smooth), so as to improve the structural reliability of the semiconductor device 300, and to promote the device performance thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
an insulating layer, disposed on the substrate;
a plurality of bit lines, disposed on the substrate; and
a bit line contact, disposed between a corresponding one of the plurality of bit lines and the substrate, to electrically connect the corresponding one of the plurality of bit lines, wherein the bit line contact comprises a first conductive layer and a first oxidized interface layer, and a bottommost surface of the first oxidized interface layer is lower than a top surface of the insulating layer, wherein the bit line contact further comprises a second oxidized interface layer, and the second oxidized interface layer and the first oxidized interface layer are respectively disposed on a top surface and a bottom surface of the first conductive layer.

2. The semiconductor device according to claim 1, wherein the first oxidized interface layer comprises a linear cross-section.

3. The semiconductor device according to claim 1, wherein the first oxidized interface layer comprises an U-shaped cross-section.

4. The semiconductor device according to claim 1, wherein the second oxidized interface layer and the first oxidized interface layer respectively comprise an U-shaped cross-section and a linear cross-section.

5. The semiconductor device according to claim 1, wherein the second oxidized interface layer and the first oxidized interface layer both comprise an U-shaped cross-section.

6. The semiconductor device according to claim 1, wherein the bit line contact further comprises a second conductive layer, and the second oxidized interface layer is disposed between the first conductive layer and the second conductive layer, and the first conductive layer and the second conductive layer comprise a same material and a same thickness.

7. The semiconductor device according to claim 1, wherein the bit line contact further comprises a semiconductor layer, and the first oxidized interface layer is disposed between the first conductive layer and the semiconductor layer, wherein a thickness of the semiconductor layer is greater than a thickness of the first conductive layer.

8. The semiconductor device according to claim 7, wherein a grain size of the semiconductor layer is greater than a grain size of the first conductive layer.

9. The semiconductor device according to claim 7, wherein the first conductive layer and the semiconductor layer comprise a same material and different lattice structures.

10. The semiconductor device according to claim 1, wherein the bottommost surface of the first oxidized interface layer is lower than a bottommost surface of the insulating layer.

11. A semiconductor device, comprising:
a substrate;
an insulating layer, disposed on the substrate;
a plurality of bit lines, disposed on the substrate; and
a plurality of bit line contacts, each disposed between a corresponding one of the plurality of bit lines and the substrate, to electrically connect the corresponding one of the plurality of bit lines, wherein each of the plurality of bit line contacts comprises a first conductive layer and a first oxidized interface layer, and a bottommost surface of the first oxidized interface layer is lower than a top surface of the insulating layer, and a topmost surface of the first oxidized interface layer is higher than a top surface of the insulating layer.

* * * * *